United States Patent
Bienek et al.

(10) Patent No.: US 7,091,780 B2
(45) Date of Patent: Aug. 15, 2006

(54) METHOD AND APPARATUS FOR OPERATING A TRANSMISSION AMPLIFIER

(75) Inventors: Bernd Bienek, Bocholt (DE); Juergen Vollmer, Bocholt (DE); Ralf Kern, Bocholt (DE)

(73) Assignee: Siemens Aktiengesellschaft, Munich (DE)

( * ) Notice: Subject to any disclaimer, the term of this patent is extended or adjusted under 35 U.S.C. 154(b) by 4 days.

(21) Appl. No.: 10/622,723

(22) Filed: Jul. 17, 2003

(65) Prior Publication Data

US 2004/0098232 A1    May 20, 2004

(30) Foreign Application Priority Data

Jul. 17, 2002  (EP)  .................................. 02015954

(51) Int. Cl.
*H03F 1/26* (2006.01)

(52) U.S. Cl. ...................... 330/149; 330/136; 330/285; 330/296; 330/261; 327/362; 375/296; 455/63; 455/126; 455/127

(58) Field of Classification Search ................ 330/149, 330/136, 129, 285, 296, 297, 261; 375/296; 455/126, 127, 63; 327/362, 560
See application file for complete search history.

(56) References Cited

U.S. PATENT DOCUMENTS

| 5,420,536 | A | 5/1995 | Faulkner et al. |
| 6,043,707 | A | 3/2000 | Budnik |
| 6,141,541 | A | 10/2000 | Midya et al. |
| 6,703,897 | B1 * | 3/2004 | O'Flaherty et al. ......... 330/149 |
| 2004/0100323 | A1 * | 5/2004 | Khanifar et al. |

FOREIGN PATENT DOCUMENTS

| GB | 2 356 093 | 5/2001 |
| JP | 361073406 A  * | 4/1986 |

* cited by examiner

*Primary Examiner*—Michael B Shingleton
(74) *Attorney, Agent, or Firm*—Bell, Boyd & Lloyd LLC

(57) ABSTRACT

A method and apparatus are provided for operating a transmission amplifier, particularly a mobile communications terminal, with the transmission amplifier being fed with a supply voltage and with any nonlinearity of the transmission amplifier being substantially compensated for via a predistortion unit for data values in an input data stream, wherein, at least at the start of transmission operation or after a considerable change in the operating parameters, the transmission amplifier is operated with a supply voltage which is of such a magnitude that the transmission amplifier operates in the linear region, and the supply voltage for the transmission amplifier is reduced to the extent to which a quality factor for the compensation for the nonlinearity of the transmission amplifier is increased by the predistortion unit.

9 Claims, 2 Drawing Sheets

METHOD AND APPARATUS FOR OPERATING A TRANSMISSION AMPLIFIER

BACKGROUND OF THE INVENTION

The present invention relates to a method for operating a transmission amplifier, such as a communications terminal, with the transmission amplifier being fed with a supply voltage, and with any nonlinearity of the transmission amplifier being substantially compensated for via a predistortion unit for data values in an input data stream, and to an apparatus for operating the transmission amplifier.

A transmission spectrum of a communications terminal, such as a mobile telephone, has to satisfy relevant requirements which are included in Standards that have to be complied with. These include the fact that the output power of the transmission spectrum in adjacent radio channels must not exceed limit values which can be found in the Standards. As such, depending on the respective type of modulation which is used by the communications terminal and which may, for example, be QPSK for (W)CDMA, it is necessary to use a transmission amplifier for the communications terminal whose linearity is subject to very stringent demands.

Transmission amplifiers such as these are costly and have a rather low energy efficiency.

For this reason, lower-cost transmission amplifiers are widely used, particularly for mobile radio base stations, and are driven well into the nonlinear region of their characteristic, which leads to high power efficiency. The pronounced nonlinearity which occurs as a consequence is compensated for by a linearization technique, wherein the incoming raw digital data is modified via a digital predistortion unit such that, overall, the actually desired linear gain is produced at an output of the transmission amplifier.

The predistortion unit thus compensates for the nonlinearity of the transmission amplifier and, if necessary, of further electronic components which influence the data values via suitable predistortion values for the digital data values.

Against this background, the present invention is directed toward providing a method and an apparatus which allow energy-efficient transmission amplifiers, which themselves satisfy stringent requirements for their linearization, to be used in communications terminals.

SUMMARY OF THE INVENTION

Against the background of the method described initially, provision is accordingly made for the transmission amplifier to be operated, at least at the start of transmission operation or after a considerable change in the operating parameters, with a supply voltage of such a magnitude that the transmission amplifier operates in the linear region, and the supply voltage for the transmission amplifier is essentially reduced to the extent to which a quality factor for the compensation for the nonlinearity of the transmission amplifier is increased by the predistortion unit.

A fundamental idea of the present invention is thus to operate the transmission amplifier with a high supply voltage such as this even in the initial phase of transmission operation, such that the transmission amplifier operates in its linear region. In other words, the transmission amplifier is provided with a sufficiently great "back-off" for its linear operation.

Following this, the supply voltage is reduced to an even greater extent, depending on the quality of the compensation for the nonlinearity of the transmission amplifier by the predistortion unit, until a supply voltage value which is suitable for continuous transmission operation is reached.

Measurement values for the quality of the compensation for the nonlinearity of the transmission amplifier by the predistortion unit are preferably used continuously to control the supply voltage for the transmission amplifier.

As already mentioned in the description of the prior art, the predistortion unit compensates for nonlinearities of the transmission amplifier. To do this, suitable predistortion factors for incoming data values must first of all actually be looked for in the initial phase of transmission operation; this is made possible, for example, by feeding back output data values which have passed through the transmission amplifier.

It is preferable for difference values between data values which are fed back from the power amplifier to the predistortion unit and data values in the input data stream to be used as measurement values. In this context, it is advantageous for averaging to be carried out, in each case, over a representative number of input data values and fed-back data values. In detail, the comparison between the input data values and the fed-back data values is based on the need to check whether the transmission amplifier is providing the desired gain factor for all the data values, and thus has been linearized. In other words, a check is carried out to determine whether the nonlinearity of the transmission amplifier has been compensated for by the predistortion factors defined by the predistortion unit.

Starting from the magnitudes of the difference values, the supply voltage then can be reduced by an amount whenever the difference values, which are preferably averaged for noise suppression purposes, fall below a threshold value. As such, the supply voltage can be reduced in steps; to be precise, to the extent that the difference values fall.

It is preferable for the measurement values to be passed by the predistortion unit from an adaptive regulator for the supply voltage of the transmission amplifier. This adaptive regulator directly influences the supply voltage and, thus, defines the framework within which the predistortion unit has to carry out its linearization task. The lower the supply voltage is chosen to be, the greater the extent to which the predistortion unit acts to provide linearization since, as the supply voltage falls, the nonlinearity of the transmission amplifier, in principle, increases. Therefore, a situation also will occur in which the supply voltage falls below a technical limit such that the predistortion unit can no longer carry out its task of linearization of the transmitter amplifier, so that it is necessary for the adaptive regulator to increase the supply voltage. To this extent, the predistortion unit and the adaptive regulator interact.

Additional features and advantages of the present invention are described in, and will be apparent from, the following Detailed Description of the Invention and the Figures.

DETAILED DESCRIPTION OF THE INVENTION

Figure 1:
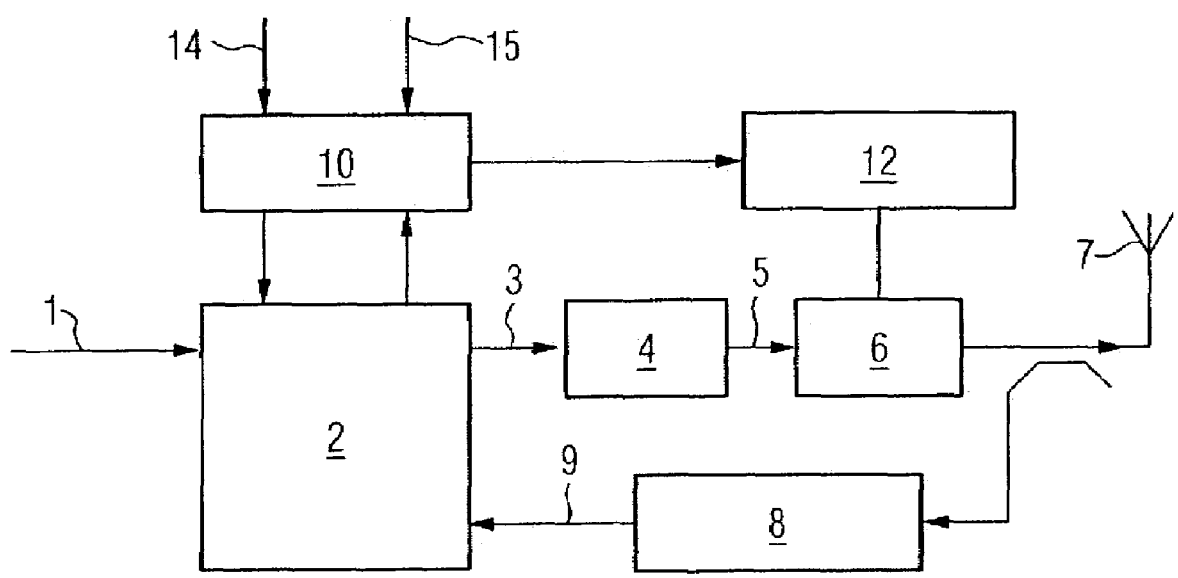
FIG. 1 shows a block diagram of an apparatus for operating a transmission amplifier for a mobile communications terminal.

As can be seen from the block diagram in FIG. 1, an incoming data stream 1 is supplied to an adaptive predistortion unit 2 for adaptive digital predistortion. A predistorted data stream 3 is passed from the predistortion unit 2 to a converter/modulator unit 4, in which the predistorted data stream is converted from digital to analog form and is modulated onto a carrier signal. An output signal 5 from the converter/modulator unit 4 is supplied to a transmission amplifier 6, whose output signal is emitted via an antenna 7 for a communications terminal.

The transmission amplifier 6 is operated during normal operation with a supply voltage VPA at which it has a nonlinear characteristic for the incoming data stream 1, so that predistortion via the predistortion unit 2 is necessary for linearization. For this reason, analog signals which are representative of the output signals from the transmission amplifier 6 are fed back via a feedback path 8 (measurement path), and are supplied via an analog/digital converter to the predistortion unit 2.

The feedback path 8 is worthwhile for the following reason: if the parameters which influence the characteristic of the transmission amplifier 6, such as the temperature and supply voltage, are not constant, as can be assumed in a mobile radio base station, then the predistortion factors which are required for linearization of the transmission amplifier 6 change. It is then reasonable for there to be at least one feedback path, which provides information about the extent to which the compensation for the nonlinearity, mainly of the transmission amplifier 6, by the predistortion unit 2 is satisfactory. The predistortion values for the predistortion unit 2 can be corrected, if necessary, with the aid of the information obtained from the feedback path 8.

The last-mentioned procedure takes account of the fact that, when a transmitter in the communication terminal is switched on, the linearization via the predistortion unit 2 has not yet been stabilized and thus is not operating correctly. This situation also can occur in the event of considerable changes in the operating parameters during transmission operation (sudden temperature changes). In this case, the nonlinear distortion in the transmission amplifier 6 leads to reduced signal quality which results, inter alia, in increased noise power in adjacent radio channels. The described linearization technique is advantageous, in particular, for mobile radio standards in which even a brief increase in the interference in adjacent radio channels is not acceptable.

In this exemplary embodiment, a comparison is carried out between incoming data values and fed-back data values within the predistortion unit 2, so that corresponding difference values are obtained. As soon as, on average, these difference values fall below a lower threshold value, the predistortion unit 2 informs an adaptive regulator 10 for a supply voltage VBA for the transmission amplifier 6 of this fact to be precise via a signal line 11. The adaptive regulator 10 controls a DC/DC converter 12, which is a variable voltage supply for the transmission amplifier 6, such that, on the basis of the predetermined lower threshold value for the difference values being undershot, the supply voltage VPA for the transmission amplifier 6 is reduced by a specific interval. The information relating to this is also supplied from the adaptive regulator 10 via a signal line 13 to the predistortion unit 2.

A step width which results in step-by-step reduction or increasing of the supply voltage VPA for the transmission amplifier 6 is defined for the supply voltage VPA for the transmission amplifier 6.

If, for example, the predistortion unit 2 indicates via the signal line 11 to the adaptive regulator 10 that the magnitude of the difference values between incoming data values 1 and fed-back data values 9 is increasing, such that an upper threshold value for the difference values is exceeded, the adaptive regulator 10 causes the converter 12 to increase the supply voltage VPA by a predetermined voltage interval. At the same time, the predistortion unit adapts the predistortion factors.

The apparatus which has been described with reference to FIG. 1 allows the transmission amplifier 6 to be operated first of all with a supply voltage VPA which is sufficiently high that the transmission amplifier 6 is operating in its linear region, so that there is no need for the predistortion unit 2 for linearization at this time. In the region of the "initial phase" of transmission operation, the difference values between fed-back data values 9 and incoming data values 1 normally will decrease in magnitude, to the same degree that the predistortion factors are optimized, so that the difference values repeatedly fall below the upper threshold value, which is in each case intended to initiate a reduction in the supply voltage VPA. The supply voltage VPA falls in steps in a corresponding manner, with the predistortion factors in each case having to be reoptimized for each change in the supply voltage VSP, since the characteristic of the transmission amplifier 6 changes. A difference value range should be provided for this purpose, within which the supply voltage is not changed, and which is defined by an upper threshold value and the lower threshold value. If the upper threshold value is exceeded, the supply voltage VSP must be raised by a predetermined amount. This results in the adaptive regulator 10 having a profile corresponding to hysteresis.

It should be stressed that the provision of threshold values for the difference values is not absolutely essential. Continuous control for the supply voltage VPA as a function of instantaneous difference values also can be provided, as long as the supply voltage VPA can be regulated continuously as a function of instantaneous difference values. Furthermore, the step width for reducing/increasing the supply voltage VPA need not necessarily be constant.

As the most important sensor values for the adaptive regulator 10 in the embodiment shown in FIG. 1, temperature values 14 and battery voltage values 15 are supplied. These likewise influence the operation of the transmission amplifier 6.

Figure 2:
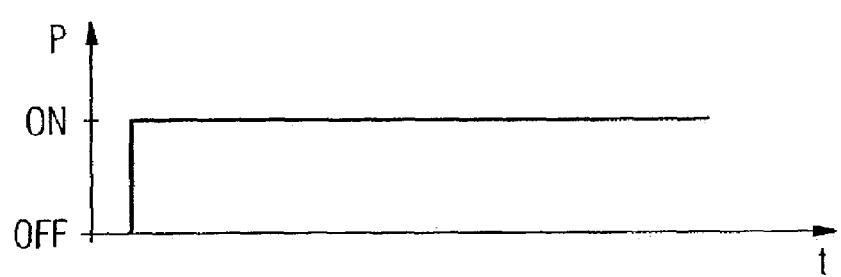
FIGS. 2, 3, 4, 5 and 6 each show time profiles of important operating parameters of the transmission amplifier in an initial phase of a transmission operation.
Figure 3:
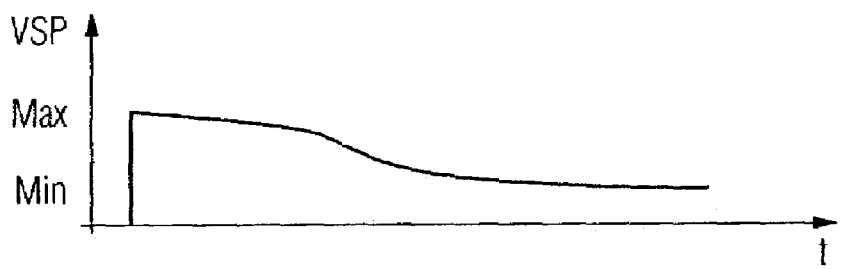
Figure 4:
Figure 5:
Figure 6:
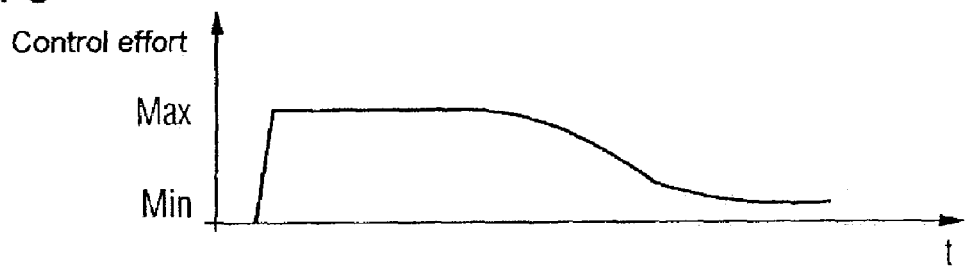

As can be seen from FIG. 2, in which the transmission power P of the antenna 7 is plotted against time, this has a constant behavior once transmission operation has started. FIG. 3 shows the time profile of the supply voltage VPA for the transmission amplifier 2 which initially receives a sufficiently high supply voltage VPA that it is operated in the linear region, after which the supply voltage is reduced continuously and later assumes a substantially constant value. FIG. 4 shows the time profile of the efficiency of the transmission amplifier 2 which converges to an increased value after stabilization. FIG. 5 shows the temperature profile plotted against time for the transmission amplifier 2, with the temperature initially rising once transmission operation starts, and then falling continuously to a substantially constant value. The control effort of the predistortion unit 2, as shown in FIG. 6, is of major importance. As can be seen, in the initial phase of transmission operation, the control effort initially rises very sharply, then remains approximately constant, after which it decreases continuously to a substantially constant value, with the latter phase being based on the fact that suitable predistortion factors for the incoming data stream have been found for the predistortion unit. In this case, the control effort refers to the number of matching processes required for the predistortion factors for the predistortion device 2 per unit time.

The procedure for the method described above and for the operation of the apparatus are identical for an initial phase of transmission operation and when a sudden change occurs in the operating parameters. If, for example, a sudden temperature change occurs, the upper threshold value for the difference values is exceeded to a major extent. If the difference values have a gradient which exceeds a predetermined gradient, the supply voltage VSP can be raised suddenly to a value at which the transmission amplifier 6 is operating linearly, even without any action by the predistortion unit 2. In this case, it then may be necessary to reset the predistortion factors to a constant value. In order to avoid a sudden change in the output power of the transmission amplifier 6, the constant value should be chosen such that the gain factor, which is obtained from the combination of the predistortion unit 2, the digital/analog converter 4 and the transmission amplifier 6, remains unchanged before and after the increase in the supply voltage VPA.

The method also may, of course, be carried out throughout the entire transmission operation of the transmission amplifier 6, with the supply voltage VSP being increased by an amount when the upper threshold value for the difference values is exceeded, and being increased by an amount when the lower threshold value for the difference values is undershot. If the difference values have a gradient that is greater than the predetermined gradient, or at the start of transmission operation, a sudden increase in the supply voltage VSP may, in the extreme case, be carried out for linear operation of the transmission amplifier 6.

Although the present invention has been described with reference to specific embodiments, those of skill in the art will recognize that changes may be made thereto without departing from the spirit and scope of the present invention as set forth in the hereafter appended claims.

The invention claimed is:

1. A method for operating a transmission amplifier, the method comprising the steps of:
    feeding the transmission amplifier a supply voltage wherein, at least at a start of transmission operation or after a change in at least one operating parameter occurs, the transmission amplifier operates in a linear region; and
    compensating for any nonlinearity of the transmission amplifier via a predistortion unit for data values in an input data stream, wherein the supply voltage is reduced to an extent to which a quality predistortion factors for the compensation for the nonlinearity of the transmission amplifier is increased by the predistortion unit, and wherein the quality of predistortion factors are independent of envelope amplitudes present in the amplifier.

2. A method for operating a transmission amplifier as claimed in claim 1, wherein measurement values for the quality of the compensation for the nonlinearity of the transmission amplifier by the predistortion unit are used continuously to control the supply voltage.

3. A method for operating a transmission amplifier as claimed in claim 2, wherein difference values between data values which are fed back from the transmission amplifier to the predistortion unit and data values in the input data stream are used as measurement values.

4. A method for operating a transmission amplifier as claimed in claim 3, wherein the supply voltage is, in each case, reduced by an amount when the difference values fall below a threshold value with a predetermined probability.

5. A method for operating a transmission amplifier as claimed in claim 4, wherein the difference values are obtained by forming representative mean values for the data values in the input data stream and the fed-back data values.

6. A method for operating a transmission amplifier as claimed in claim 2, wherein the measurement values are passed by the predistortion unit from an adaptive regulator for the supply voltage for the transmission amplifier.

7. An apparatus for operating a transmission amplifier, comprising:
    a voltage supply for the transmission amplifier;
    an adaptive regulator for controlling the voltage supply wherein at least at a start of transmission operation or after a change in at least one operating parameter occurs, the transmission amplifier operates in a linear region; and
    a predistortion unit for processing data values in an input data stream for compensating for any nonlinearity of the transmission amplifier, with the regulator interacting with the predistortion unit, wherein the supply voltage is reduced to an extent to which a quality of predistortion factors for the compensation for the nonlinearity of the transmission amplifier is increased by the predistortion unit, and wherein the quality of predistortion factors are independent of envelope amplitudes present in the amplifier.

8. An apparatus for operating a transmission amplifier as claimed in claim 7, wherein the predistortion unit forms difference values between data values, which are fed back from the transmission amplifier to the predistortion unit, and data values in the input stream, and transmits the difference values to the adaptive regulator.

9. An apparatus for operating a transmission amplifier as claimed in claim 8, wherein the adaptive regulator converts the difference values for controlling the voltage supply of the transmission amplifier.

* * * * *